United States Patent [19]

Zhao et al.

[11] Patent Number: 5,660,682

[45] Date of Patent: Aug. 26, 1997

[54] PLASMA CLEAN WITH HYDROGEN GAS

[75] Inventors: Joe W. Zhao, San Jose; Zhihai Wang; Wilbur G. Catabay, both of Santa Clara, all of Calif.

[73] Assignee: LSI Logic Corporation, Milpitas, Calif.

[21] Appl. No.: 615,437

[22] Filed: Mar. 14, 1996

[51] Int. Cl.⁶ .................................................. H01L 21/461
[52] U.S. Cl. ........................ 438/715; 134/1.2; 438/723; 438/725
[58] Field of Search ..................... 134/1.2; 156/643.1, 156/662.1, 644.1, 646.1; 216/80

[56] References Cited

U.S. PATENT DOCUMENTS

| | | | |
|---|---|---|---|
| 4,357,203 | 11/1982 | Zelez | 156/643 |
| 5,000,819 | 3/1991 | Pedder | 156/643 |
| 5,089,441 | 2/1992 | Moslehi | 437/225 |
| 5,432,073 | 7/1995 | Wu et al. | 437/195 |

OTHER PUBLICATIONS

"Low Temperature In Situ Surface Cleaning of Oxide-Patterned Wafers By Argon/Hydrogen Plasma Sputter"; Yew et al.; J. Appl Phys, (1990'); 68 (9); pp. 4681–4693.

"Low Temperature In Situ Cleaning of Silicon Wafers With An Ultrahigh Vacuum Compatible Plasma Source"; Ram et al., pp. 126–131; 1992; Thin Solid Films, 222 (1–2).

*Primary Examiner*—R. Bruce Breneman
*Assistant Examiner*—George Goudreau
*Attorney, Agent, or Firm*—Luedeka, Neely & Graham, P.C.

[57] ABSTRACT

A method of removing material from an integrated circuit. The integrated circuit is placed within a reaction chamber, and a flow of argon and a flow of hydrogen are introduced into the reaction chamber, where the flow of hydrogen is greater than the flow of argon. The flows of argon and hydrogen are energized to form a plasma, and the material is removed from the integrated circuit by reaction of the material with the energized flows of argon and hydrogen to form gaseous products, which are pumped out of the reaction chamber. The plasma and flows of argon and hydrogen are discontinued when a desired amount of material has been removed, and the integrated circuit is removed from the reaction chamber.

18 Claims, 1 Drawing Sheet

PLASMA CLEAN WITH HYDROGEN GAS

FIELD OF THE INVENTION

This invention relates to the field of microelectronics processing. More particularly the invention relates to the field of plasma cleaning integrated circuit devices.

BACKGROUND OF THE INVENTION

Integrated circuits are formed by depositing several layers of different materials. As each layer is deposited, it is patterned according to the function for which the layer is designed. For example, a layer that is designed to be part of an electrical interconnect system may be formed of a metal based compound. The layer of metal based compound may then be etched to form patterns of contact areas which are joined by leads.

The pattern in which a layer is to be formed is often created by a photolithographic process. In a typical method, the deposited layer is coated with a polymer based photoresist. A mask, having the image of the pattern desired, is placed in proximity to the photoresist covered layer. The image from the mask is transferred to the photoresist by irradiating the areas of the photoresist which are not covered by the pattern in the mask. After irradiation, the photoresist is developed, and portions of the photoresist are washed away, as defined by the pattern in the mask. Thus, certain areas of the layer to be patterned are covered with photoresist, and other areas of the layer are exposed.

The exposed areas of the layer can be removed by using either a wet or dry etch. A wet etch is typically done with a water based solution that reacts with and removes those portions of the layer not protected by the photoresist. A dry etch may be done by sputtering either an inert gas, or a gas which reacts with the material of the layer, against the layer. Etching wears the exposed areas of the layer away, while leaving intact those areas of the layer protected by the photoresist. In this manner the pattern is transferred from the mask, to the photoresist, and then finally to the layer itself.

Once the layer is patterned, the photoresist is usually removed, to prepare the integrated circuit for the deposition of additional layers, or other subsequent processing. It is important that as much of the photoresist as possible be removed prior to subsequent processing. If some photoresist is left intact on the surface of a layer, it may interfere with the proper operation of the finished integrated circuit. For example, if a second metal layer were to be deposited on top of a first metal layer, photoresist remaining on the first metal layer may create an open circuit in areas where the two layers were intended to make ohmic contact.

The photoresist may be removed by use of an aqueous solution, either alone or in combination with physical scrubbing or pulsed jets. However, the aqueous based solutions, and other methods of photoresist removal, tend to induce the formation of oxides, such as silicon oxide, on the exposed surfaces of the integrated circuit. Oxides on the surface of a layer can create the same types of problems as described above for the photoresist. Therefore, before a subsequent layer of the integrated circuit is deposited, the previously deposited and patterned layer should be free of undesirable material, such as the oxides and polymeric photoresist, and other solutions.

The integrated circuit may be plasma cleaned with an inert gas, such as argon, to remove the undesirable material. The energized argon ions created by the plasma tend to physically bombard the material on the integrated circuit, dislodging it in a manner such that it can be pumped away in a gaseous state. The relatively flat areas of the integrated circuit are not excessively difficult to adequately clean in this manner.

However, the recessed areas of the integrated circuit, such as vias, are more difficult to clean. This is especially true as the geometry of integrated circuits has shrunk. The reduction in device geometry has typically resulted in an increase in the aspect ratio of topographical features, such as vias. The aspect ratio of a feature is the depth of the feature divided by the width of the feature. Thus, as the aspect ratio increases, it is an indication that the depth of the feature is increasing in proportion to the width of the feature.

It has become increasingly difficult to adequately remove material from the relatively deeper, narrower vias required by newer generation integrated circuits. The reason for this is that the material dislodged by the argon at the bottom of a high aspect ratio via tends to redeposit on the side walls of the via before it can escape the deep, narrow via. The material may also redeposit on the flatter areas of the integrated circuit. This creates problems with the integrated circuit during subsequent processing and use.

What is needed, therefore, is a method of removing undesirable material, such as oxides and polymers, from integrated circuits having high aspect ratio topographical features, in a manner such that the material is not redeposited on the integrated circuit.

SUMMARY OF THE INVENTION

The above and other objects are met by a method of removing material from an integrated circuit. The integrated circuit is placed within a reaction chamber, and a flow of argon and a flow of hydrogen are introduced into the reaction chamber, where the flow of hydrogen is greater than the flow of argon. The flows of argon and hydrogen are energized to form a plasma, and the integrated circuit is kept within the plasma, thereby converting the material to gaseous byproducts, for a length of time sufficient to remove at least some of the material from the integrated circuit.

BRIEF DESCRIPTION OF THE DRAWINGS

Further advantages of the invention will become apparent by reference to the detailed description of the invention when considered in conjunction with the following drawings, which are not to scale, and in which like reference numerals denote like elements throughout the several views, and wherein.

DETAILED DESCRIPTION OF THE INVENTION

Figure 1:
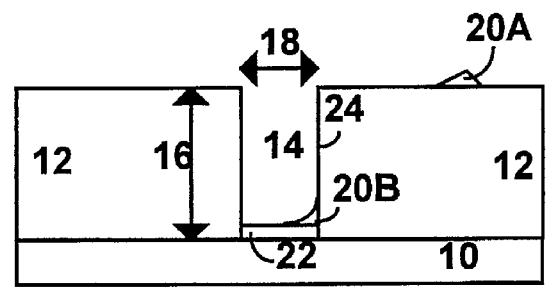
FIG. 1 is a cross-sectional view of an integrated circuit having a via.

Referring now to the drawings, there is depicted in FIG. 1 a cross-sectional view of an integrated circuit comprising substrate 10 and layer 12. Formed in layer 12 there is a via 14, having height 16 and width 18. While the present invention is equally applicable to vias 14 with other aspect ratios, the invention is particularly appropriate for vias 14 with aspect ratios greater than two.

At the bottom of via 14, and against the substrate 10, there is formed a layer of material, such as oxide 22. If the substrate 10 is a silicon substrate, then the oxide layer 22 may be silicon oxide. In one corner at the bottom of the via 14 is some material 20B, such as a polymer which has been left behind from a previous etching step. On the top surface of layer 12 is more polymer 20A, also left behind from a previous etching step.

The undesired material, such as polymers 20A and 20B and oxide 22, tend to cause problems with the proper operation of the integrated circuit if they are allowed to remain. For example, oxide 22 may inhibit or prevent a desired electrical connection between the substrate 10 and a subsequently deposited layer. Polymers 20A and 20B may reduce the adhesion between a subsequently deposited layer and the substrate 10 and the layer 12, thus causing the subsequently deposited layer to delaminate, and the integrated circuit to fail.

To remove the material 20A, 20B, and 22, the integrated circuit is placed within a reaction chamber. While several different reaction chambers are acceptable to implement a method according to the present invention, in the preferred embodiment a model Endura, manufactured by AMT of Santa Clara, Calif. is used.

A flow of argon is introduced into the reaction chamber at a flow rate of between about one sccm and about twenty sccm, and most preferably about five sccm. A flow of hydrogen is also introduced into the reaction chamber at a flow rate of between about one sccm and about 100 sccm, and most preferably about twenty sccm. The flow rates of the argon and hydrogen should be sufficient to allow for a plasma to form, which removes the material from the integrated circuit, according to the invention.

In the preferred embodiment the ratio of the flow of hydrogen to the flow of argon is between about 1:20 and about 100:1, and most preferably about 4:1. The reaction chamber is preferably connected to a vacuum pump, which maintains the pressure of the reaction chamber at between about one mtorr and about twenty mtorr, and most preferably about three mtorr.

Figure 2:
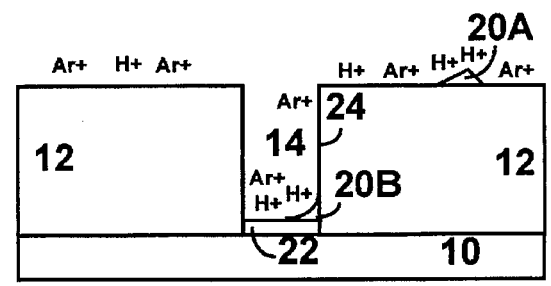
FIG. 2 is a cross-sectional view of energized flows of hydrogen and argon penetrating a via.

The flows of hydrogen and argon are energized to create positive argon and hydrogen ions, as depicted in FIG. 2. The ions may be created in a plasma, such as that induced by an RF generator. In the preferred embodiment the RF generator operates at a power of between about twenty watts and about 400 watts, and most preferably 250 watts, and at a frequency of between about fifty KHz and about 400 KHz, and most preferably about 200 KHz. The temperature within the reaction chamber is preferably maintained at between about twenty-five °C. and about 400° C., and most preferably about 200° C.

The ions of argon and hydrogen may, in a preferred embodiment, be accelerated toward the integrated circuit by a negative DC bias of between about 10 volts and about 600 volts, and most preferably about 400 volts. The ions are drawn down into the via 14 by the DC bias.

The larger argon ions physically bombard the material 20A, 20B, and 22, dislodging portions of it, and helping to increase its surface area. Bombardment by argon ions alone may remove the polymer 20A from the integrated circuit. However, because the via 14 has such a high aspect ratio, some of the polymer 20B and oxide 22 dislodged by the argon ions may redeposit on the sidewalls 24 of the via 14. Thus, according to the present invention, the argon ions are supplemented with hydrogen ions.

Figure 3:
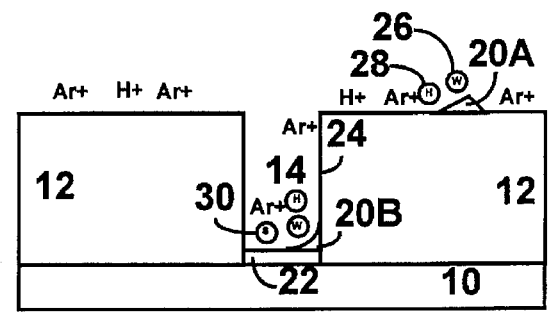
FIG. 3 is a cross-sectional view of gaseous byproducts produced in a via.

The hydrogen ions are reactive with the material 20A, 20B, and 22. The reaction between the hydrogen ions and the polymers 20A and 20B produces water vapor 26 and hydrocarbon gas 28, as depicted in FIG. 3. The reaction between the hydrogen ions and the oxide 22 produces gaseous $SiH_x$ 30. These gaseous byproducts 26, 28, and 30 tend to not redeposit on the sidewalls 24 of the via 14, and thus may be removed from the integrated circuit and the chamber, for example by pumping, resulting in a more thorough clean than that which could be performed with the argon alone.

Figure 4:
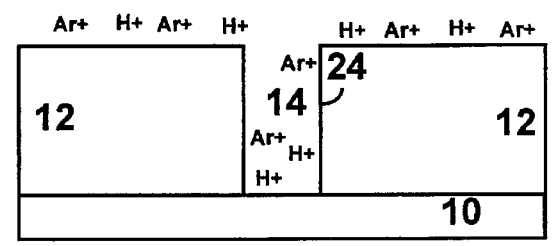
FIG. 4 is a cross-sectional view of a cleaned via.

When the desired amounts of material 20A, 20B, and 22 have been removed, the plasma and flows of argon and hydrogen are discontinued. In the preferred embodiment all of the material 20A, 20B, and 22 are removed by allowing the reaction to continue for a period of time of between about five seconds and about five minutes, and most preferably about one minute. At this point most, and preferably all, of material 20A, 20B, and 22 has been removed from the integrated circuit, as depicted in FIG. 4. The integrated circuit may then be removed from the reaction chamber.

While specific embodiments of the invention have been described with particularity above, it will be appreciated that the invention is equally applicable to numerous processes well known to those skilled in the art.

What is claimed is:

1. A method of removing material from the vias of an integrated circuit comprising:

placing the integrated circuit within a reaction chamber, introducing a flow of argon into the reaction chamber, introducing a flow of hydrogen into the reaction chamber, where the flow of hydrogen is greater than the flow of argon, energizing the flows of argon and hydrogen with an RF power source operating at between twenty watts and 400 watts to form a plasma, applying a negative bias to the integrated circuit while it is within the plasma, of between ten volts and 600 volts, maintaining the reaction chamber at a temperature of between twenty-five °C. and 400° C., and keeping the integrated circuit within the plasma, thereby converting the material to gaseous byproducts, for a length of time sufficient to remove at least some of the material from the integrated circuit.

2. The method of claim 1 further comprising pumping the gaseous byproducts out of the reaction chamber.

3. The method of claim 1 further comprising:

keeping the integrated circuit within the plasma for a length of time sufficient to remove substantially all of the material from the integrated circuit, and removing the integrated circuit from the reaction chamber.

4. The method of claim 1 whereto the flow of argon is between one sccm and twenty sccm.

5. The method of claim 1 wherein the flow of hydrogen is between one sccm and 100 sccm.

6. The method of claim 1 wherein the ratio of the flow of hydrogen to the flow of argon is no greater than 100:1.

7. The method of claim 1 wherein the material removed from the integrated circuit comprises polymers and oxides.

8. The method of claim 5 wherein the gaseous byproducts comprise water vapor, hydrocarbon gases, and $SiH_x$.

9. The method of claim 1 wherein the integrated circuit is kept within the plasma for a period of time of between five seconds and five minutes.

10. A method of removing polymers and oxides from the vias of an integrated circuit comprising:

placing the integrated circuit within a reaction chamber, introducing a flow of argon into the reaction chamber of between one sccm and twenty sccm, introducing a flow of hydrogen into the reaction chamber of between one sccm and 100 sccm, where the ratio of the flow of hydrogen to the flow of argon is between 1:20 and 100:1, energizing the flows of argon and hydrogen by an RF power source operating at between twenty watts and 400 watts to form a plasma, maintaining the temperature within the reaction chamber at between twenty-five °C. and 400° C., keeping the integrated circuit within the plasma, thereby converting the polymers and oxides to water vapor, hydrocarbon gases, and $SiH_x$, for a length of time of between five seconds and five minutes, applying a negative bias to the integrated circuit while it is within the plasma, of between ten volts and 600 volts, pumping the water vapor, hydrocarbon gases, and $SiH_x$ out of the reaction chamber, and removing the integrated circuit from the reaction chamber.

11. A method of removing polymers from high aspect ratio vias on an integrated circuit comprising:

placing the integrated circuit within a reaction chamber, introducing a flow of argon into the reaction chamber, introducing a flow of hydrogen into the reaction chamber, where the flow of hydrogen is greater than the flow of argon, energizing the flows of argon and hydrogen with an RF power source operating at between twenty watts and 400 watts to form a plasma, penetrating the vias with the energized flows of argon and hydrogen, applying a negative bias to the integrated circuit while it is within the plasma, of between ten volts and 600 volts, maintaining the reaction chamber at a temperature of between twenty-five °C. and 400° C., maintaining the reaction chamber at a pressure of between one mtorr and twenty mtorr, and keeping the integrated circuit within the plasma, thereby converting the polymers to gaseous byproducts, for a length of time sufficient to remove at least some of the polymers from the integrated circuit.

12. The method of claim 11 wherein the flow of argon is between one sccm and twenty sccm.

13. The method of claim 11 wherein the flow of hydrogen is between one sccm and 100 sccm.

14. The method of claim 11 wherein the ratio of the flow of hydrogen to the flow of argon is no greater than 100:1.

15. The method of claim 11 wherein the aspect ratio of the via is larger than 0.8:1.

16. A method of removing silicon oxide from high aspect ratio vias on an integrated circuit comprising:

placing the integrated circuit within a reaction chamber, introducing a flow of argon into the reaction chamber, introducing a flow of hydrogen into the reaction chamber, where the flow of hydrogen is greater than the flow of argon, energizing the flows of argon and hydrogen with an RF power source operating at between twenty watts and 400 watts to form a plasma, applying a negative bias to the integrated circuit while it is within the plasma, of between ten volts and 600 volts, maintaining the reaction chamber at a temperature of between twenty-five °C. and 400° C.

maintaining the reaction chamber at a pressure of between one mtorr and twenty mtorr, penetrating the vias with the energized flows of argon and hydrogen, removing silicon oxide from the vias by reacting the silicon oxide with the energized flows of argon and hydrogen to form $SiH_x$, pumping the $SiH_x$ out of the reaction chamber, discontinuing the plasma and flows of argon and hydrogen after a period of time of between five seconds and five minutes, and removing the integrated circuit from the reaction chamber.

17. The method of claim 16 wherein the ratio of the flow of hydrogen to the flow of argon is no greater than 100:1.

18. The method of claim 16 wherein the aspect ratio of the via is larger than 0.8:1.

\* \* \* \* \*